United States Patent [19]

Takahashi

[11] Patent Number: 5,159,338
[45] Date of Patent: Oct. 27, 1992

[54] SAMPLING FREQUENCY CONVERSION APPARATUS

[75] Inventor: Yasuo Takahashi, Yokosuka, Japan

[73] Assignee: Kabushiki Kaisha Toshiba, Kawasaki, Japan

[21] Appl. No.: 800,247

[22] Filed: Nov. 29, 1991

[30] Foreign Application Priority Data

Nov. 30, 1990 [JP] Japan .................................. 2-340272
Nov. 7, 1991 [JP] Japan .................................. 3-291552

[51] Int. Cl.$^5$ ............................................. H03M 7/00
[52] U.S. Cl. ................................... 341/61; 341/122
[58] Field of Search ................ 341/61, 55, 122, 123; 375/23; 364/724.1

[56] References Cited

U.S. PATENT DOCUMENTS

| | | | |
|---|---|---|---|
| 3,564,414 | 2/1971 | Ebert | 341/61 X |
| 3,766,542 | 10/1973 | Tomozawa | 341/61 |
| 4,044,306 | 8/1977 | Villeret et al. | 341/61 |
| 4,954,824 | 9/1990 | Yamada et al. | 341/61 |

FOREIGN PATENT DOCUMENTS 62101112 10/1985 Japan .
637006 6/1986 Japan .

OTHER PUBLICATIONS

"Method for Constructing a Sampling Frequency Converter"; The Journal of the Acoustical Society of Japan, vol. 39, No. 4, (1983); pp. 221–229; M. Kasuga (JVC).

*Primary Examiner*—Sharon D. Logan
*Attorney, Agent, or Firm*—Oblon, Spivak, McClelland, Maier & Neustadt

[57] ABSTRACT

A sampling frequency conversion apparatus according to this invention converts an input data string based on an input sampling pulse into a data string based on an output sampling pulse having a frequency different from the frequency of the input sampling pulse. The apparatus reproduces the input sampling pulse based on the input data string, generates interpolation sampling pulses having a frequency corresponding to an integral multiple of the frequency of the input sampling pulse, and generates an interpolated data string from the input data string on the basis of the interpolation sampling pulses. On the other hand, the apparatus phase-modulates the output sampling pulse to diffuse its frequency spectrum, and selects and determines a timing of the interpolation sampling pulse closest to the timing of the phase-modulated output sampling pulse. The apparatus selects data corresponding to the selected timing from the interpolated data string, and outputs the selected data.

4 Claims, 9 Drawing Sheets

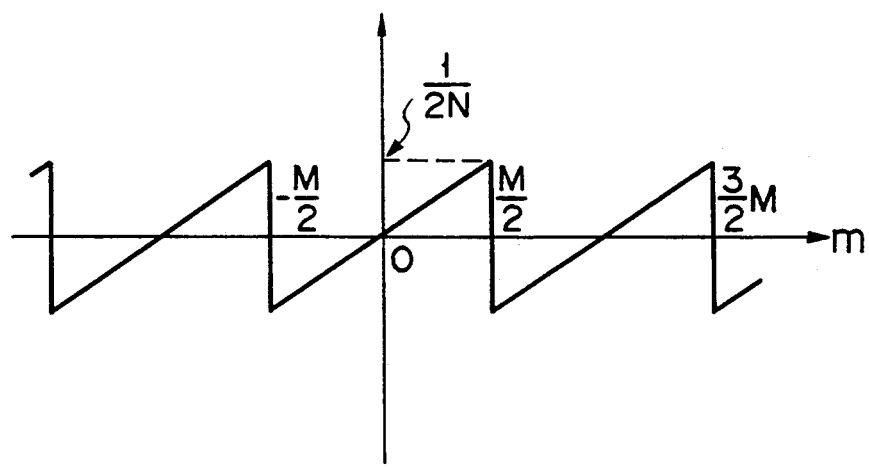
F I G. 6
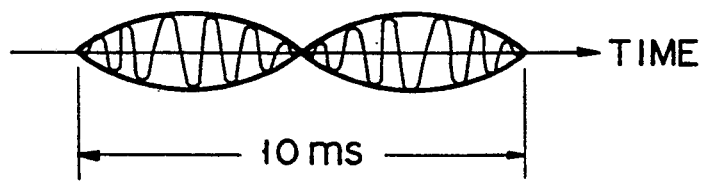
F I G. 7

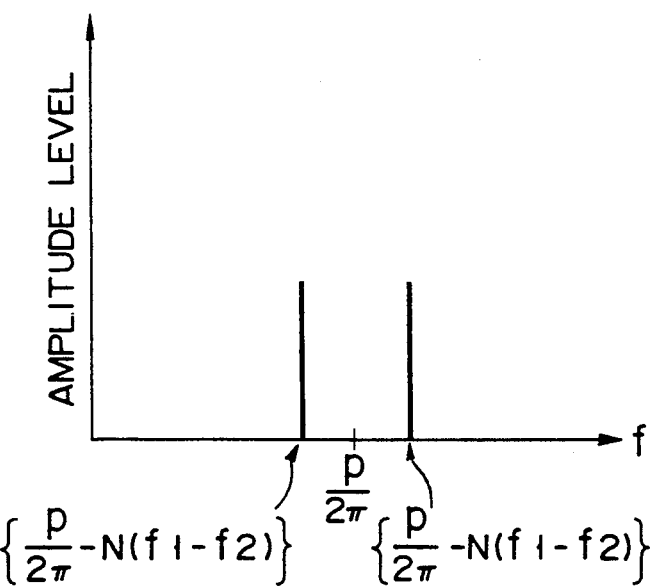
F I G. 8A
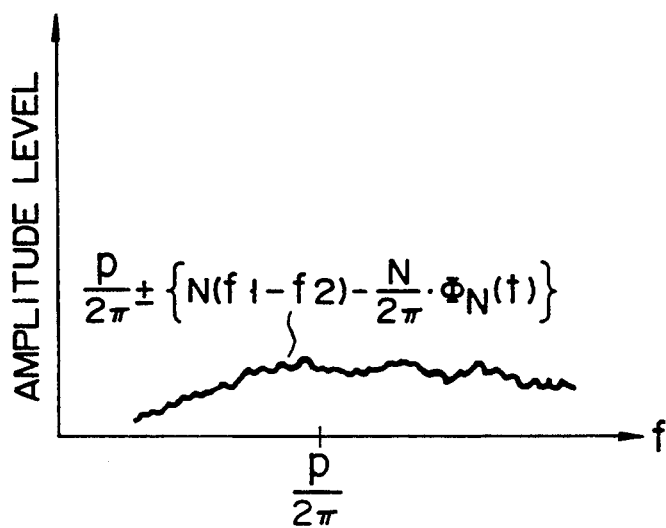
F I G. 8B

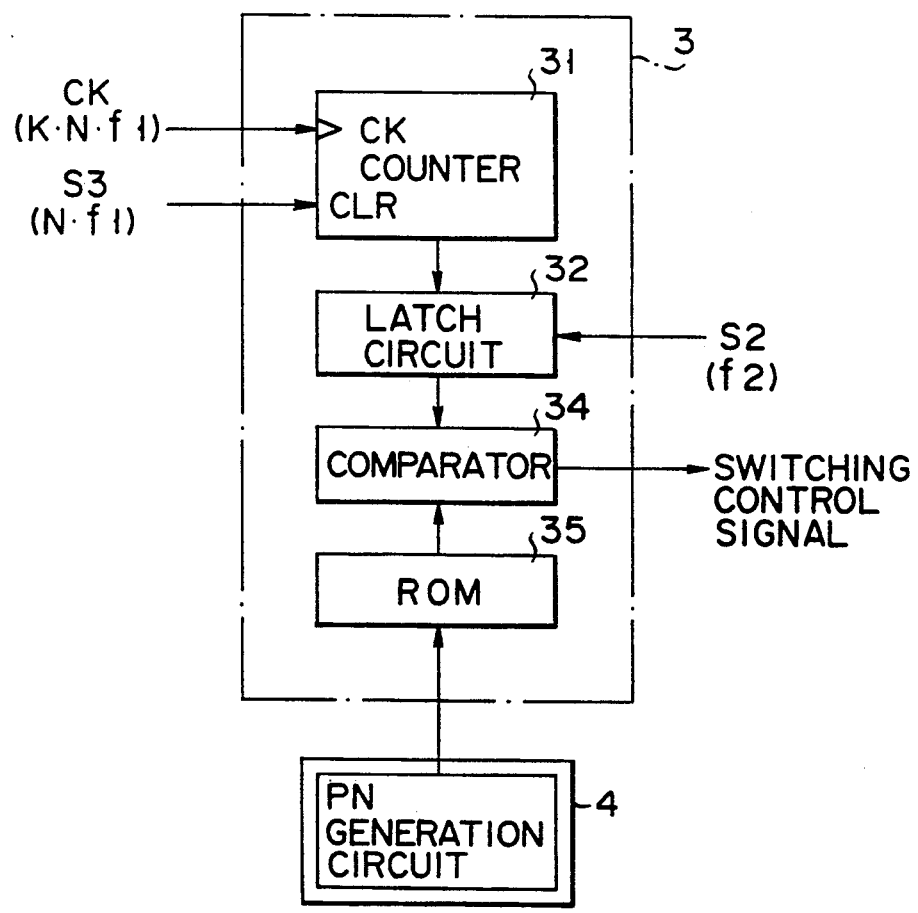
F I G. 9

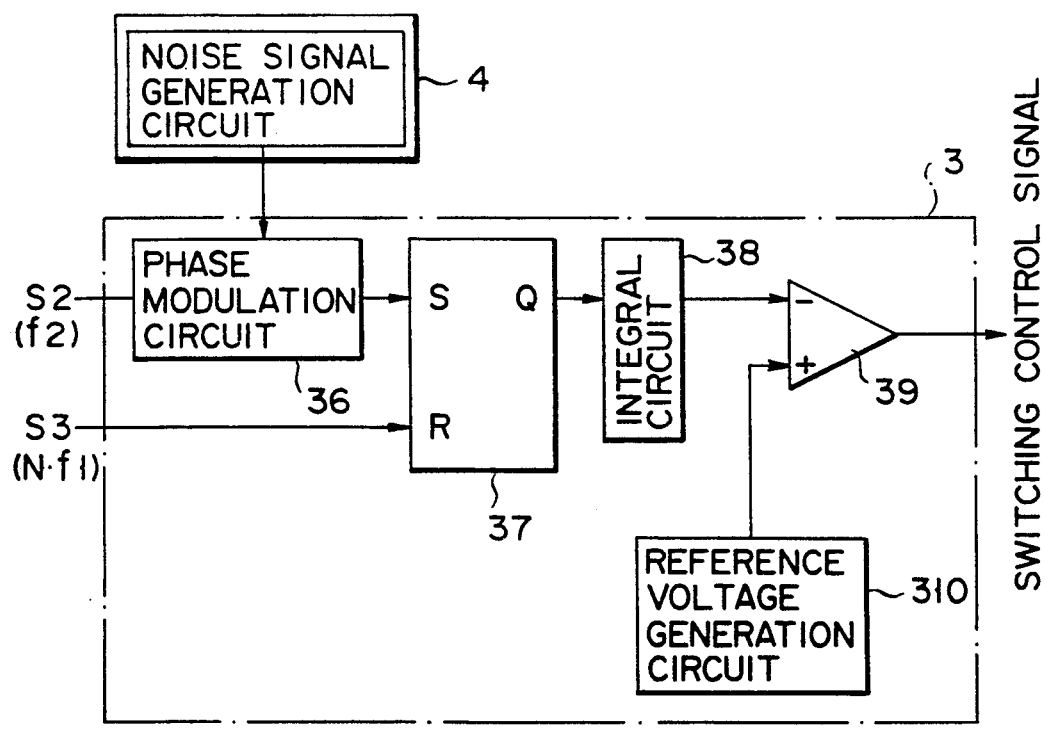
F I G. 10
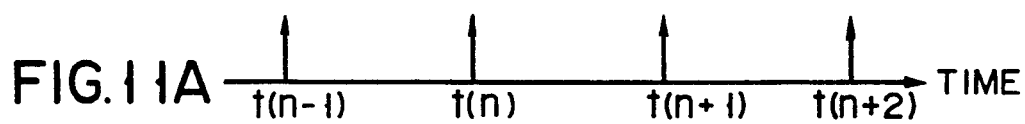
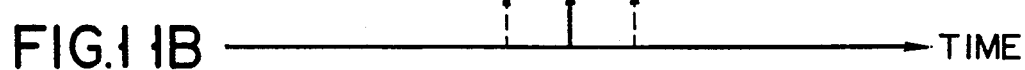
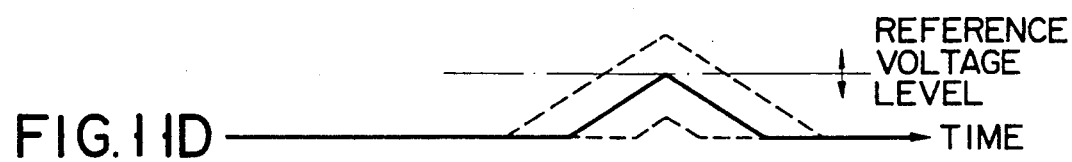

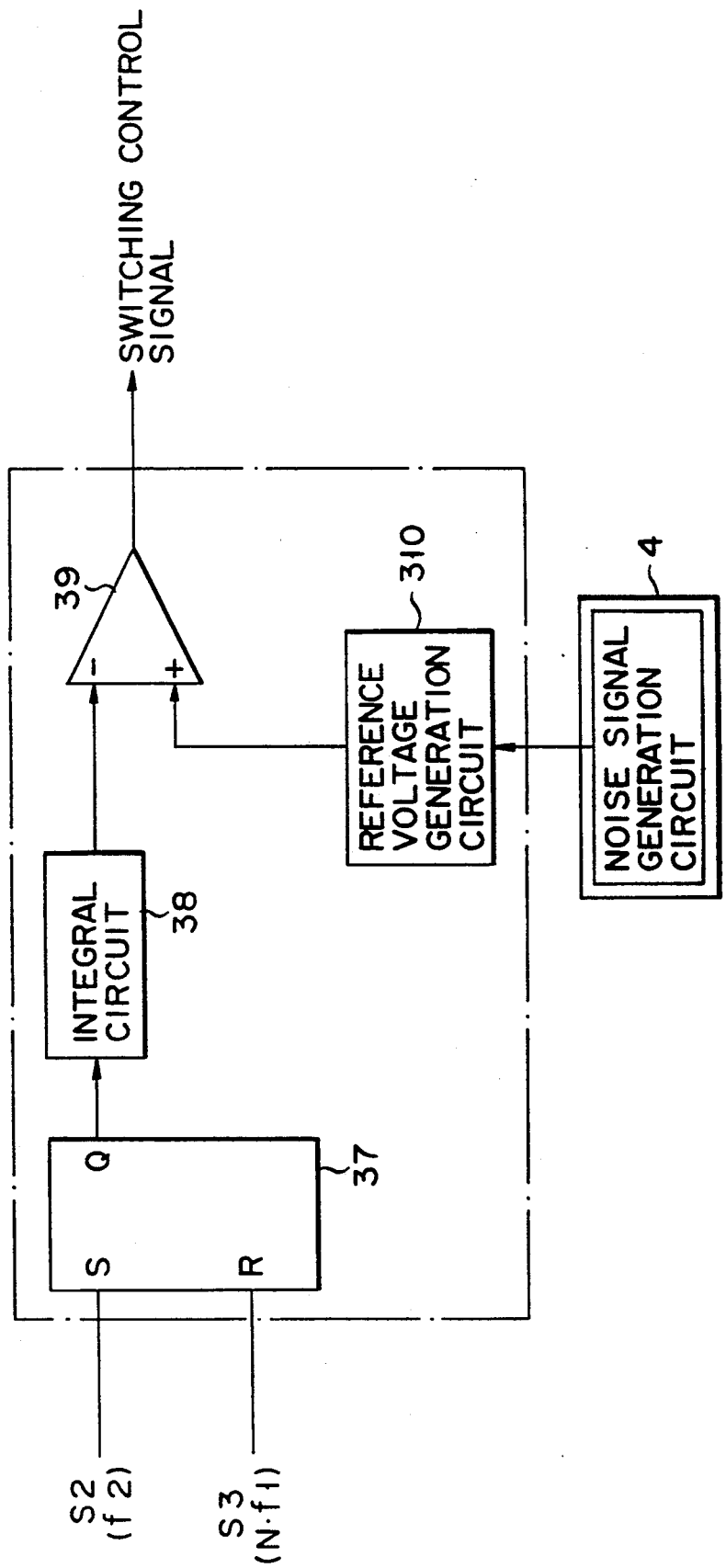
F I G. 12

SAMPLING FREQUENCY CONVERSION APPARATUS

BACKGROUND OF THE INVENTION

1. Field of the Invention

The present invention relates to a sampling frequency conversion apparatus for converting, e.g., a digital audio signal into a digital audio signal having a different sampling frequency.

2. Description of the Related Art

Conventionally, when a digitally recorded signal is converted into a signal having a different sampling frequency, the digital signal is temporarily D/A (digital-to-analog)-converted into an analog signal, and the analog signal is A/D (analog-to-digital)-converted at a different sampling frequency again. Although this method allows reliable conversion, the signal is deteriorated since D/A conversion and A/D conversion are performed. In addition, since an A/D converter and a D/A converter must be arranged, the signal tends to be deteriorated by mixing of, e.g., hum noise.

In consideration of the above situation, a D/D (digital-to-digital) conversion method for directly converting a digital signal to a digital signal having another sampling frequency has been put into practical applications.

In a general sampling frequency conversion apparatus employing the D/D conversion method, sampling pulses having a frequency corresponding to the least common multiple of input and output sampling pulses are generated. An input data string is interpolated at timings of the generated pulses, and data coinciding with the timings of the output sampling pulses are extracted and output from the interpolated data string. This method is effective when the input and output sampling pulses have a relatively large frequency difference, and the least common multiple can be easily calculated. However, when the frequency difference is small, the least common multiple becomes too large to realize the method.

In the conventional method, when input and output sampling pulses have a small frequency difference, an interpolated data string is generated on the basis of sampling pulses having a given frequency, and data closest to timings of the output sampling pulses are extracted and output. However, when such approximation processing is performed for, e.g., a digital audio signal, interference components which depend on the sampling frequency difference appear in an audio frequency band, resulting in deterioration beyond an allowable level in the auditory sense.

SUMMARY OF THE INVENTION

It is an object of the present invention to provide a sampling frequency conversion apparatus, which can reduce interference components which depend on a sampling frequency difference when a digital signal is directly converted into a digital signal having another sampling frequency, thereby reducing, e.g., the amount of deterioration in the auditory sense after conversion.

According to the present invention, there is provided with a sampling frequency conversion apparatus comprising a sampling frequency conversion apparatus for converting an input data string based on an input sampling pulse into a data string based on an output sampling pulse having a frequency different from a frequency of the input sampling pulse, and outputting the converted data string, comprising: an interpolation sampling pulse generation circuit for reproducing the input sampling pulse from the input data string, and generating interpolation sampling pulses having a frequency corresponding to an integral multiple of the frequency of the input sampling pulse; a data interpolation circuit for fetching the input data string, and generating an interpolated data string on the basis of the interpolation sampling pulses; a timing selection circuit for selecting one of timings of the interpolation sampling pulses before and after the timing of the output sampling pulse; a data selection circuit for selecting and output data, corresponding to the timing selected by said timing selection circuit, from the interpolated data string; and selection control means for randomly changing a selection reference of said timing selection circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 4 to 8B are waveform charts for explaining detailed operations of the embodiment shown in FIG. 1;

FIGS. 9, 10, and 12 are block diagrams showing other embodiments of a timing selection circuit and a selection control circuit shown in FIG. 2, respectively; and FIGS. 11A to 11D are timing charts for explaining the operation of the embodiment shown in FIG. 10.

DETAILED DESCRIPTION OF THE PREFERRED EMBODIMENTS

An embodiment of the present invention will be described below with reference to the accompanying drawings.

Figure 1:
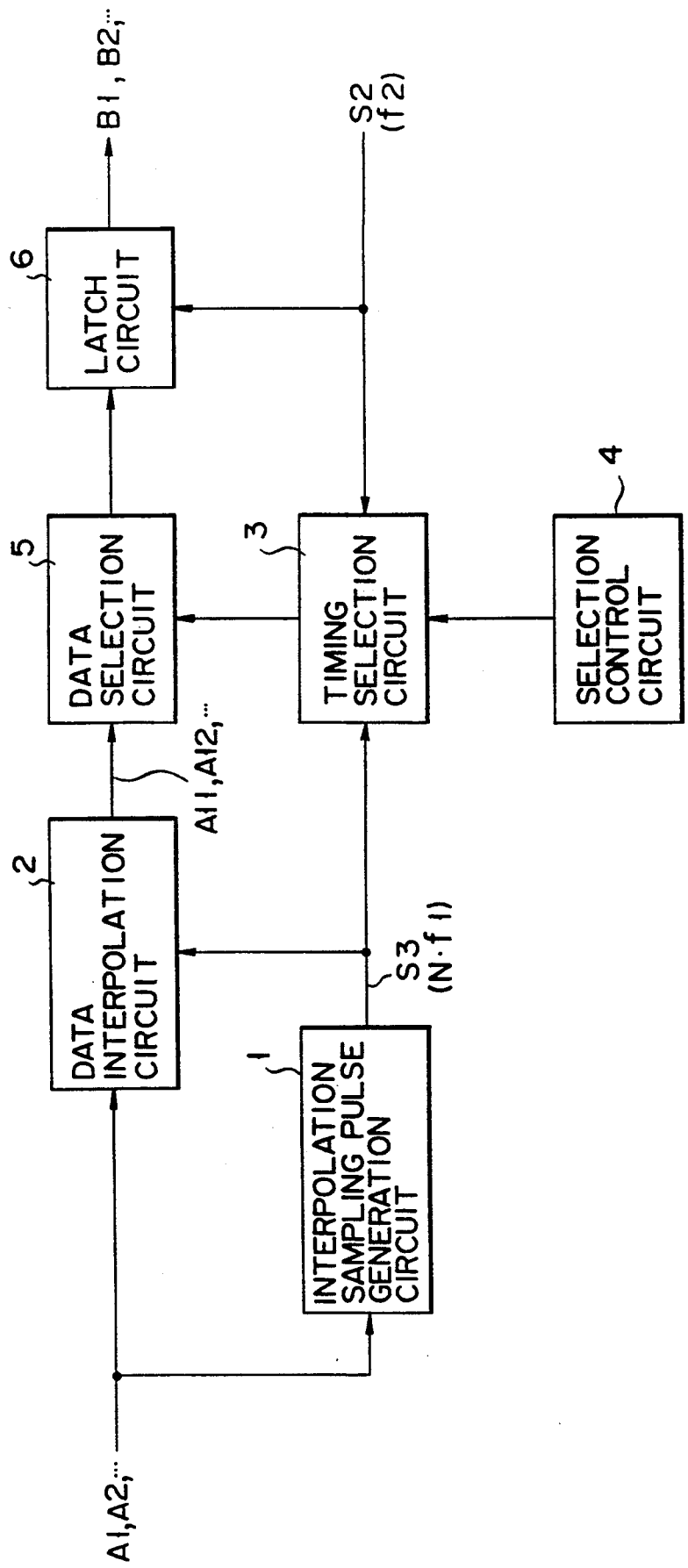
FIG. 1 is a block diagram showing a basic arrangement of a sampling frequency conversion apparatus according to an embodiment of the present invention.

FIG. 1 shows a basic arrangement of a sampling frequency conversion apparatus employing a D/D conversion method according to the present invention. Reference numerals A1, A2, ... denote an input data string of a digital signal obtained by sampling an audio signal at a frequency f1. Reference numeral S2 denotes output sampling pulses having a frequency f2. The frequency f2 is very close to the input sampling frequency f1. The output sampling pulses S2 are supplied from digital equipment (not shown) as an output destination.

The data string (A1, A2, ...) is supplied to an interpolation sampling pulse generation circuit 1, and a data interpolation circuit 2. The interpolation sampling pulse generation circuit 1 reproduces input sampling pulses S1 having the frequency f1 from the input data string, and multiplies the input sampling pulses S1 with N (N is a natural number), thereby generating sampling pulses (to be referred to as interpolation sampling pulses hereinafter) S3 having a frequency N·f1. The interpolation sampling pulses S3 are supplied to the data interpolation circuit 2 and a timing selection circuit 3.

The data interpolation circuit 2 performs, e.g., linear interpolation of the input data string (A1, A2, ...) on the basis of the interpolation sampling pulses S3, thereby generating an interpolated data string (A11, A12, ...). The interpolated data string (A11, A12, ...) is supplied to a data selection circuit 5.

The timing selection circuit 3 receives the interpolation sampling pulse S3 and the output sampling pulses S2, selects timings of the interpolation sampling pulses before or after the input timings of the pulses S2, and outputs the selected timing information. This selection is randomly made by a selection control circuit 4.

For example, the selection control circuit 4 generates a noise signal. The timing selection circuit 3 phase-modulates the output sampling pulses S2 on the basis of the noise signal to disperse the frequency spectrum of the pulses S2, and discriminates timings of the interpolated sampling pulses closest to modulated pulses S2', thus outputting the timing information.

The data selection circuit 5 selects data corresponding to the timings selected by the timing selection circuit 3 from the interpolated data string (A11, A12, ...), and outputs the selected data. The selected data are sent to a latch circuit 6, and are sequentially output at the timings of the output timing pulses S2, thereby obtaining an output data string (B1, B2, ...).

Figure 2:
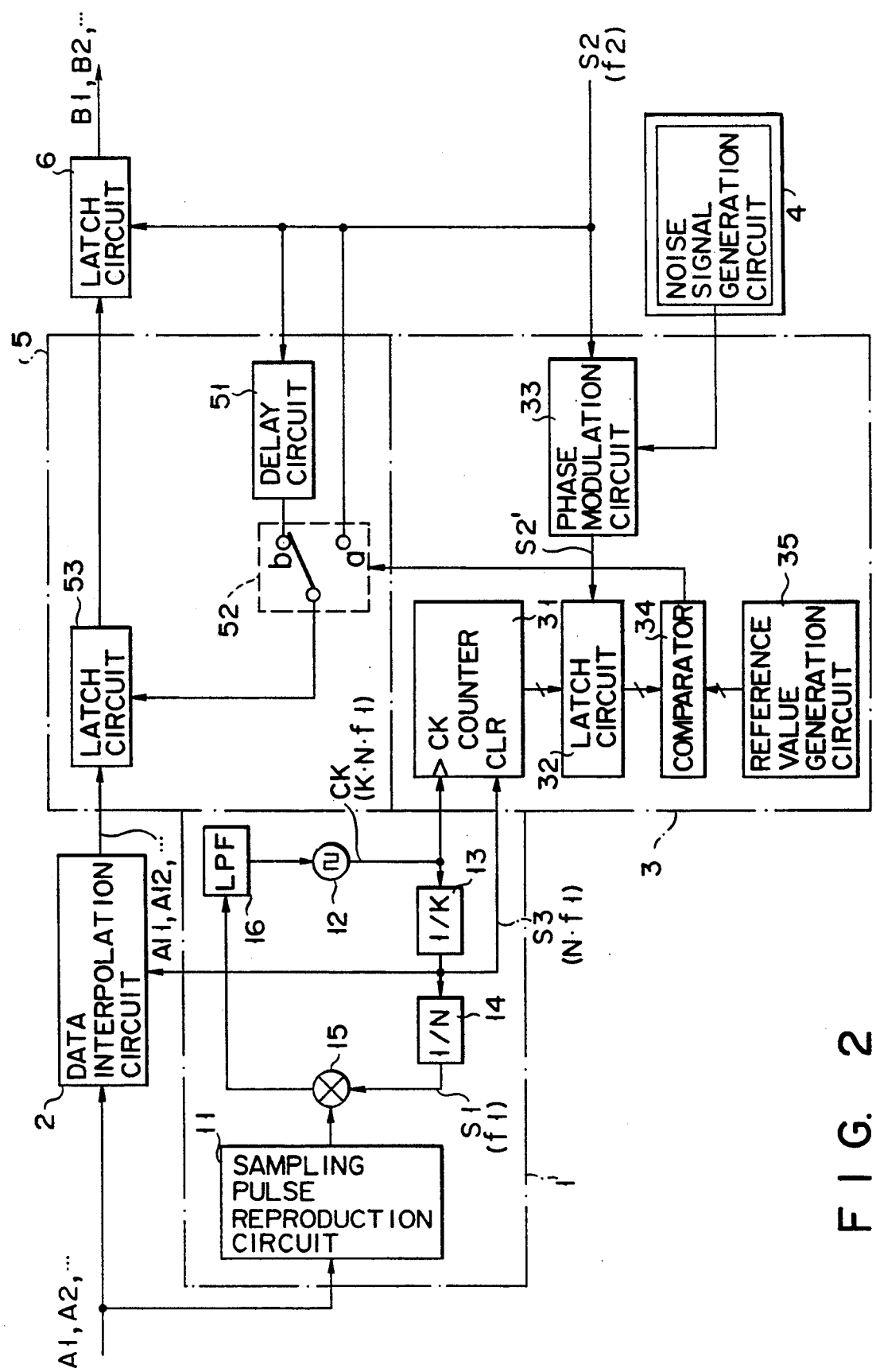
FIG. 2 is a block diagram showing a detailed arrangement of principal part in the embodiment shown in FIG. 1.

The detailed arrangement of principal part in the above-mentioned basic arrangement will be described below with reference to FIG. 2.

In the interpolation sampling pulse generation circuit 1, a sampling pulse reproduction circuit 11 reproduces the input sampling pulses S1 on the basis of the input data string (A1, A2, ...), and supplies the reproduced pulses to a PLL (Phase-Locked Loop) circuit. The PLL circuit causes first and second frequency dividers 13 and 14 to sequentially frequency-divide clock pulse outputs from a VCO (Voltage Controlled Oscillator) 12 to 1/K and 1/N, respectively, and inputs the frequency-divided clock pulses to a mixer 15 to mix them with the input sampling pulses S1. The mixed outputs are converted into a voltage signal by an LPF (Low-Pass Filter) 16, and the voltage signal controls the VCO 12, thereby locking the oscillation frequency of the VCO 12 to K·N·f1. In this manner, clock pulses CK having a frequency K·N·f1 are obtained from the VCO 12, and the interpolation sampling pulses S3 having a frequency N·f1 are obtained from the first frequency divider 13.

In the timing selection circuit 3, the clock pulses CK are counted by a counter 31, and the counter 31 is cleared by the interpolation sampling pulses S3. The count value of the counter 31 is supplied to a latch circuit 32. The latch circuit 32 holds the count value of the counter 31 at the timings of the output sampling pulses S2' sent through a phase modulation circuit 33. The count value latched by the latch circuit 32 is supplied to a comparator 34. The comparator 34 compares the count value from the latch circuit 32 with a reference value from a reference value generation circuit 35. When the count value is larger than the reference value, the comparator 34 generates a high-level switching control signal (timing information shown in FIG. 1); otherwise, it generates a low-level switching control signal.

Figure 3:
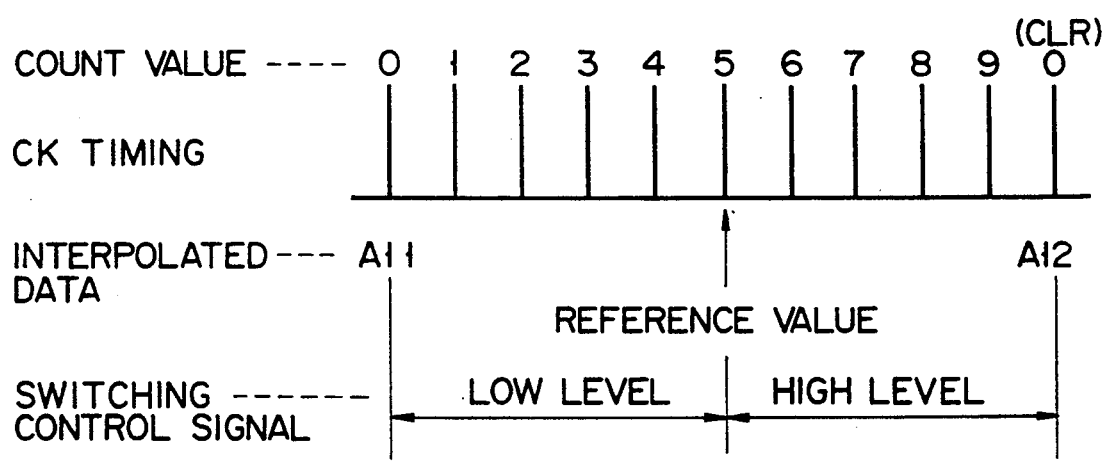
FIG. 3 is a waveform chart for explaining a basic operation of the embodiment shown in FIG. 1.

For example, assume that K=10, and the output sampling pulse S2' is input between interpolated data A11 and A12. As shown in FIG. 3, the counter 31 is cleared to "0" at a count "10". At this time, the interpolated data are switched. If the reference value of the reference value generation circuit 35 is set to be "5", when the latch output from the latch circuit 32 is smaller than "5", it is determined that the input timing of the output sampling pulse S2' is close to the former interpolated data (A11 in FIG. 3), thereby outputting the low-level switching control signal. On the other hand, when the latch output from the latch circuit 32 is equal to or larger than "5", it is determined that the input timing of the output sampling pulse S2' is close to the latter interpolated data (A12 in FIG. 3), thereby outputting the high-level switching control signal.

If the selection control circuit 4 comprises a noise signal generation circuit, and a noise signal generated by the circuit 4 is input to the phase modulation circuit 33, the output sampling pulses S2 are phase-modulated by the noise signal, and their frequency spectrum is dispersed. The latch circuit 32 latches the count value at the input timings of the phase-modulated pulses S2'.

The data selection circuit 5 comprises a delay circuit 51 for delaying the output sampling pulses S2 by one interpolation sampling period. When the switching control signal from the timing selection circuit 3 is at low level, a switch 52 is set at the terminal a side so as to directly fetch the output sampling pulses S2, and to supply them to a latch circuit 53. When the switching control signal is at high level, the switch 52 is set at the terminal b side to supply output pulses S4 from the delay circuit 51 to the latch circuit 53. The latch circuit 53 latches and outputs interpolated data upon pulse input.

The operation of the above arrangement will be described in detail below.

Figure 4:
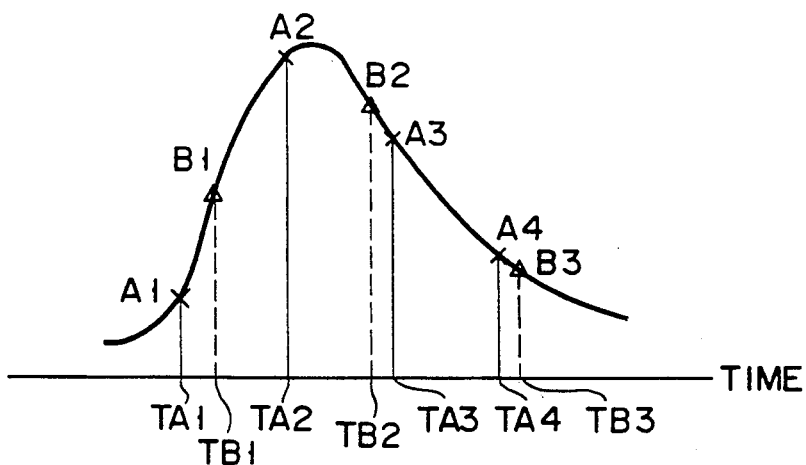

A case will be examined below wherein a data string (A1, A2, ...) obtained by converting an input audio signal shown in FIG. 4 into a digital signal based on sampling pulses S1 (at timings TA1, TA2, ... in FIG. 4) having a frequency f1 is to be converted into a data string (B1, B2, ...) based on sampling pulses S2 (timings TB1, TB2, ... in FIG. 4) having a frequency f2 close to the frequency f1.

Figure 5A:
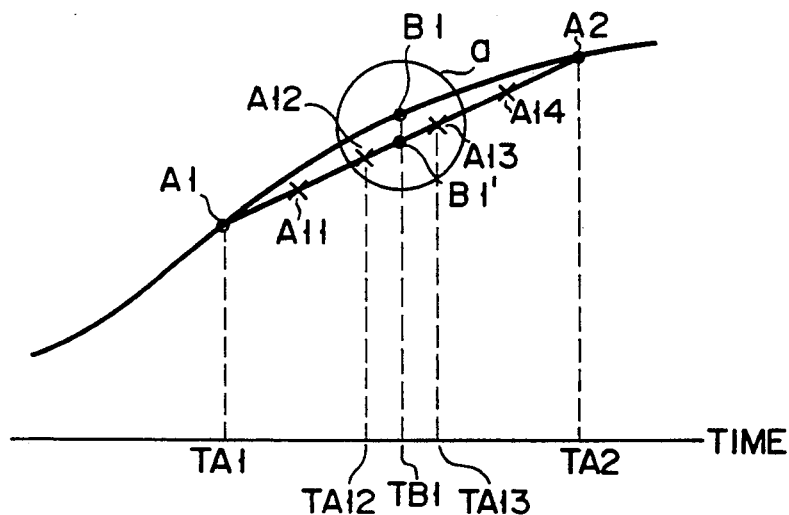
Figure 5B:
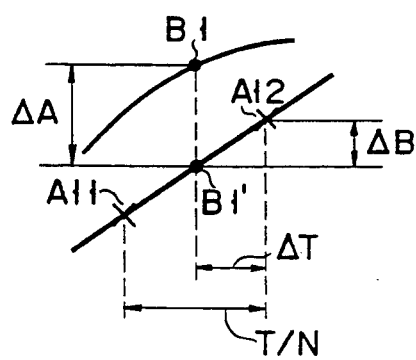

As described above, when the frequencies f1 and f2 have a small difference therebetween, the output data string (B1, B2, ...) cannot be perfectly estimated from the input data string (A1, A2, ...). Therefore, the data B1, B2, ... must be estimated using some approximation equations. As a typical example, data between A1 and A2 may be linearly interpolated based on A1 and A2. FIGS. 5A and 5B show the content of linear interpolation. FIG. 5B is an enlarged view of a portion a in FIG. 5A.

When data between A1 and A2 is linearly interpolated, an estimation value at a sampling timing TB1 of the output data string is B1'. However, in order to precisely measure the relationship between the timings TA1 and TA2, and the timing TB1, clocks having a higher frequency than the two sampling frequencies are required. As an actual circuit, a complicated, expensive circuit is required to precisely measure the relationship between the timings TA1, TA2, ... and the timings TB1, TB2, ... using high-frequency clocks.

Thus, a sampling interval is equally divided into five to ten sections by the data interpolation circuit 2 so as to generate an interpolated data string (A11, A12, ...) based on the input data string (A1, A2, ...). The data selection circuit 5 selects interpolated data (A13 in FIG. 5A) at a sampling timing closest to the timing TB1, and uses the selected data as output data. At this time, an interpolation error ΔA is made from the difference between the true value data B1 and the approximate value data A13, and an error ΔB is made from the sampling-time error ΔT, i.e., the period between the time the data B1 is obtained and the time the data A13 is obtained.

The interpolation error ΔA is a component, which depends on an original signal waveform, and is normally expressed as deterioration of a distortion factor. This component does not pose a serious auditory problem. In addition, this component can be eliminated by improving interpolation precision. On the other hand, the error ΔB depends on the difference between a sampling phase of an original signal, and an output sampling phase. When frequencies f1 and f2 of the two sampling phases coincide with each other, a time difference between the timings TB1 and TA13 in FIG. 5A is constant, and the error ΔB becomes an error which depends only on the original signal waveform like in 66 A. However, when the frequencies f1 and f2 are different from each other, the error ΔB depends on (f1−f2). Therefore, strange tones which are not present in an original signal are mixed in the D/D conversion process, resulting in uneasy auditory feeling For example, parameters are set as follows:
T: period of input sampling pulses S1
N: the number of interpolated data in input data string
An integer M is assumed as follows:

$$MT = 1/(f1 - f2) = 1/\Delta f \quad (1)$$

More specifically, M is the number of samples necessary for generating a difference of an 1/N period between the input and output sampling frequencies f1 and f2, and Δf is the frequency difference between f1 and f2. For the sake of simplicity, Δf>0 is assumed.

When the above-mentioned interpolation error ΔA is zero (i.e., interpolation is perfect), a sampling time error ΔB(m) generated in an mth sampling timing interval ΔT(m) is given by:

$$\Delta B(m) = f(Tm/N + Tm/MN) - f(Tm/N) \quad (2)$$

where m satisfies $-M/2 < m \leq M/2$, and f(x) is the input signal.

In equation (2), the first term in the right-hand side represents mth output sampling data, and the second term represents mth input sampling data. Therefore, when a change in input signal is slower than an interval T/N of the interpolated data string, equation (2) can be approximated as follows as a product of a differential coefficient f' and a sampling timing interval ΔT(m) at time (Tm/N+Tm/MN):

$$\Delta B(m) = f'(Tm/N + Tm/MN) \cdot \Delta T(m) \quad (3)$$

ΔT(m) can be given by the following equation:

$$\Delta T(m) = Tm/MN \quad (4)$$

where m satisfies $-M/2 < m < M/2$. When equations (3) and (4) are expanded, the following general formula is obtained:

$$\Delta T(m) = T[m - IM\{(m + \tfrac{1}{2})/M\}]/MN \quad (5)$$

where IM{(m+½)/m} is a function expressing an integral part of a real number (m+½)/M. Therefore, equation (5) means a sawtooth wave having a period M, as shown in FIG. 6.

ΔB(m) obtained when an input signal is a sine wave will be examined below. An input signal f(t) can be expressed by:

$$f(t) = a \sin pt \quad (6)$$

where p is the angular velocity. The differential coefficient f' is given by:

$$f'(t) = a \cdot p \cos pt \quad (7)$$

On the other hand, the sawtooth wave given by equation (5) can be expanded as follows by utilizing the Fourier expansion:

$$\begin{aligned} T(t) &= \left[ \sum_{n=1}^{\infty} (-1)^{n-1} \sin\{(2\pi nN/MT)t\}/n \right] T/\pi N \\ &= [\sin\{(2\pi nN/MT)t\} - \sin\{(4\pi nN/MT)t\} \\ &\quad + \sin\{(6\pi nN/MT)t\} + \ldots]T/\pi N \end{aligned} \quad (8)$$

Equation (8) is roughly approximated to assume the following equation:

$$\Delta T(t) \approx (T/\pi N) \cdot \sin\{(2\pi N/MT)t\} \quad (9)$$

When equations (7) and (9) are substituted in equation (3), ΔB(t) is given by:

$$\Delta B(t) \approx a \cdot p \cos pt \cdot (T/\pi N) \cdot \sin\{(2\pi N/MT)t\} \quad (10)$$

In equation (10), since MT is given by equation (1), ΔB(t) is given by:

$$\Delta B(t) \approx a \cdot p(T/\pi) \cdot (1/N)$$
$$\times \cos pt \cdot \sin 2\pi N(F1 - f2)t \quad (11)$$

For example, FIG. 7 shows an error waveform obtained when the original signal is a 1-kHz sine wave, the sampling frequency difference is 10 Hz, and the number of interpolated data is 10. As can be seen from FIG. 7, when the sampling frequency difference is small, frequency component of N(f1−f2) appears in the audio frequency band, resulting in deterioration beyond an allowable auditory level.

The apparatus with the above arrangement solves this problem as follows. That is, the output sampling pulses (frequency f2) S2 are temporarily input to the phase modulation circuit 33 so as to be phase-modulated by a noise signal, and thereafter, timings for selecting interpolated data are set. This principle will be explained below.

The pulse S2' output from the phase modulation circuit 33 of the timing selection circuit 3 is given by:

$$S2' = \sin\{2\pi f2 \cdot t + \phi_N(t)\} \quad (12)$$

where $\phi_N(t)$ is the phase component as a result of phase modulation based on the noise signal. Therefore, the error ΔB(t) given by equation (11) is rewritten as:

$$\Delta B(t) = a \cdot p \cdot (T/\pi) \cdot (1/N) \cos pt \times \sin[2\pi N(f_1 - f_2)t - N \cdot \phi_N(t)] \quad (13)$$

More specifically, the frequency spectrum of the error $\Delta B(t)$ given by equation (11) is as shown in FIG. 8A, and the frequency spectrum of the error $\Delta B(t)$ given by equation (13) is as shown in FIG. 8B according to equation (13). As can be seen from FIGS. 8A and 8B, when frequency conversion is performed based on the sampling pulse S2', the spectrum is dispersed to a wide frequency band by the component $N \cdot \phi_N(t)$ phase-modulated by noise, and formation of a specific spectrum can be prevented.

Therefore, the sampling frequency conversion apparatus with the above arrangement can prevent mixing of specific beat noise, and interference components which depend on the sampling frequency difference can be eliminated, thus obtaining a good auditory digital signal.

In the above embodiment, phase modulation is performed using a noise signal. Alternatively, phase modulation may be performed by a pseudo random signal so as to diffuse the frequency spectrum to a wide range, thus obtaining the same effect as described above. In this case, the selection control circuit 4 comprises a PN (pseudo random noise) generation circuit, and a pseudo random signal generated by this circuit can be input to the phase modulation circuit 33 of the timing selection circuit 3.

In the above embodiment, the phase of the output sampling pulses S2 is modulated. Alternatively, the reference value shown in FIG. 2 may be randomly changed to obtain the same effect as described above. FIG. 9 shows this arrangement. The same reference numerals in FIG. 9 denote the same parts as in FIG. 2, and a detailed description thereof will be omitted.

The reference signal generation circuit 35 in FIG. 9 employs a ROM (Read-Only Memory), which stores several kinds of values within a range between 0 and K. The selection control circuit 4 comprises a PN generation circuit, and a pseudo random signal generated by this circuit is supplied to the ROM as a read address. Thus, the reference value can be randomly changed, and the same effect as in the case wherein the output sampling pulses S2 are phase-modulated can be consequently obtained. In addition, the arrangement can be simplified.

In each of the above embodiments, the timing selection circuit 3 is realized by digital processing. If the timing selection circuit 3 is constituted as shown in FIG. 10 or 12, it can be realized by analog processing.

The timing selection circuit 3 shown in FIG. 10 comprises a phase modulation circuit 36, an S-R flip-flop 37, an integral circuit 38, a level comparator 39, and a reference voltage generation circuit 310, and the selection control circuit 4 comprises a noise signal generation circuit. More specifically, the set terminal S of the S-R flip-flop 37 receives output sampling pulses S2' phase-modulated based on a noise signal by the phase modulation circuit 36, and the reset terminal R thereof receives interpolation sampling pulses S3. The output Q from the flip-flop 37 is integrated by the integral circuit 38 and is supplied to one input terminal (−) of the level comparator 39. The other input terminal (+) of the level comparator 39 receives a reference voltage generated by the reference voltage generation circuit 310. More specifically, the level comparator 39 compares the integral result and the reference voltage, and outputs the comparison result as a switching control signal for controlling the switch 52.

Assume that the interpolation sampling pulses S are input at timings shown in Fig. 11A, and the output sampling pulse S2 is input at a timing between timings t(n) and t(n+1) of the pulses S3, as shown in Fig. 11B. The output Q from the flip-flop 37 becomes a pulse signal, as shown in Fig. 11C, and an integral output is increased/decreased in proportion to the pulse width of the output Q, as shown in Fig. 11D. The reference voltage is set to have an intermediate level between the maximum and minimum levels of the integral output.

In this state, when the output sampling pulse S2 is close to the former timing t(n) of the interpolation sampling pulses S3, the integral output exceeds the reference voltage level, the switching control signal goes to high level, and the data selection circuit 5 selects and holds data corresponding to the former timing t(n). On the other hand, when the output sampling pulse S2 is close to the latter timing t(n+1) of the pulses S3, the integral output does not exceed the reference voltage level, the switching control signal is kept at low level, and the data selection circuit 5 selects and holds data corresponding to the latter timing t(n+1).

The phase modulation circuit 36 phase-modulates the output sampling pulse S2 based on a noise signal generated by the selection control circuit 4. Thus, the timings t(n) and t(n+1) before and after the pulse S3 can be randomly selected, thus obtaining the same effect as in the above embodiments.

Alternatively, as shown in FIG. 12, the output sampling pulse S2 may be supplied to the S-R flip-flop 37 without being phase-modulated, and instead, the reference voltage level may be changed by a noise signal generated by the selection control circuit 4, thus obtaining the same effect as described above. Note that the same reference numerals in FIG. 12 denote the same parts as in FIG. 10, and a detailed description thereof will be omitted.

Various other changes and modifications may be made within the spirit and scope of the invention.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A sampling frequency conversion apparatus for converting an input data string based on an input sampling pulse into a data string based on an output sampling pulse having a frequency different from a frequency of the input sampling pulse, and outputting the converted data string, comprising:

an interpolation sampling pulse generation circuit for reproducing the input sampling pulse from the input data string, and generating interpolation sampling pulses having a frequency corresponding to an integral multiple of the frequency of the input sampling pulse;

a data interpolation circuit for fetching the input data string, and generating an interpolated data string based on the interpolation sampling pulses;

a timing selection circuit for selecting one of a plurality of timings of the interpolation sampling pulses before or after an input timing of the output sampling pulse;

a data selection circuit for selecting an output data, corresponding to the timing selected by said timing selection circuit, from the interpolated data string; and selection control means for randomly changing a selection reference of said timing selection circuit.

2. An apparatus according to claim 1, wherein said timing selection circuit comprises a phase modulation circuit for phase-modulating the output sampling pulse, and selects a timing of the interpolation sampling pulses closest to the input timing of the output sampling pulse phase-modulated by said phase modulation circuit; and said selection control means comprises a noise signal generation circuit for supplying a noise signal to said phase modulation circuit, and the output sampling pulse is phase-modulated by the noise signal.

3. An apparatus according to claim 1, wherein said timing selection circuit comprises a phase modulation circuit for phase-modulating the output sampling pulse, and selects a timing of the interpolation sampling pulses closest to the input timing of the output sampling pulse phase-modulated by said phase modulation circuit; and said selection control means comprises a pseudo random signal generation circuit for supplying a pseudo random signal to said phase modulation circuit, and the output sampling pulse is phase-modulated by the pseudo random signal.

4. An apparatus according to claim 1, wherein said timing selection circuit comprises reference timing setting means for setting a reference timing between the interpolation sampling pulses, and comparison means for comparing the input timing of the output sampling pulse and the reference timing, and selects one of the plurality of the interpolation sampling pulse before or after the timing of the output sampling pulse based on a comparison result of said comparison means; and said selection control means comprises timing control means for randomly changing the reference timing set by said reference timing setting means.

* * * * *